(12) United States Patent
Wang et al.

(10) Patent No.: US 6,465,891 B2
(45) Date of Patent: Oct. 15, 2002

(54) INTEGRATED-CIRCUIT PACKAGE WITH A QUICK-TO-COUNT FINGER LAYOUT DESIGN ON SUBSTRATE

(75) Inventors: Wen-Hsin Wang, Taichung; Chih-Chin Liao, Changhua, both of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/766,476

(22) Filed: Jan. 19, 2001

(65) Prior Publication Data
US 2002/0096788 A1 Jul. 25, 2002

(51) Int. Cl.[7] .............................................. H01L 23/48
(52) U.S. Cl. ........................ 257/773; 257/776; 257/784
(58) Field of Search ................................. 257/666, 784, 257/786, 737, 773, 776

(56) References Cited

U.S. PATENT DOCUMENTS 5,898,213 A * 4/1999 Torres et al. ............... 257/666

\* cited by examiner

*Primary Examiner*—David L. Talbott
*Assistant Examiner*—Luan Thai
(74) *Attorney, Agent, or Firm*—Peter F. Corless; Steven M. Jensen; Edwards & Angell, LLP

(57) ABSTRACT

An integrated-circuit package with a quick-to-count finger layout design on substrate is proposed, which can help fabrication engineers to visually check the total number of fingers on the substrate in a quick and accurate manner. The proposed integrated-circuit package is characterized by the provision of a line-up array of fingers which includes a plurality of first-shape fingers partitioned equally in number into a plurality of subgroups; and a plurality of second-shape fingers, which are substantially visually distinguishable in outer appearance from the first-shape fingers, and which are interposed between adjacent subgroups of the first-shape fingers to serve as count tokens. This finger layout design allows the fabrication engineers to visually check the total number of the line-up array of fingers on the substrate simply by counting through the second-shape fingers that serve as count tokens and then multiply the result by the number of first-shape fingers in each subgroup plus one.

12 Claims, 2 Drawing Sheets

INTEGRATED-CIRCUIT PACKAGE WITH A QUICK-TO-COUNT FINGER LAYOUT DESIGN ON SUBSTRATE

BACKGROUND OF THE INVENTION

1. Field of the Invention

This invention relates to integrated circuit packaging technology, and more particularly, to an integrated-circuit package with a quick-to-count finger layout design on substrate, which can help fabrication engineers to visually count the total number of electrically-connecting fingers on the substrate in a quick and accurate manner.

2. Description of Related Art

An integrated-circuit package is typically constructed of a semiconductor chip mounted over a substrate. To allow external connections, the substrate is formed with a plurality of electrically-conductive bond pads, commonly called "fingers", which are arranged around the semiconductor chip. During wire-bonding process, these fingers are bonded by means of a plurality of electrically-conductive wires, such as gold wires, to the respective bond pads on the semiconductor chip.

FIG. 1 shows a schematic plan view of an integrated-circuit package with a conventional finger layout design on substrate. As shown, the integrated-circuit package includes: (a) a substrate 100; (b) a semiconductor chip 110 mounted over the substrate 100, and whose top surface is formed with a plurality of bond pads 111; (c) a line-up array of fingers 120 surrounding the semiconductor chip 110; and (d) a plurality of bonding wires 130 for connecting the bond pads 111 respectively to the fingers 120 (note that FIG. 1 is a simplified schematic diagram showing only those parts that are related to the invention; the actual layout on the substrate 100 may be much more complex).

By the conventional finger layout design, the line-up array of fingers 120 are all identically-shaped and equally sized, so that their outer appearances are virtually undistinguishable from each other.

During the packaging process, as the wire-bonding step is completed, the fabrication engineers need to check the wire-bonded fingers 120 for the total number thereof This task is customarily carried out by visually inspecting the fingers 120 and mentally counting the total number thereof However, since today's advanced technology are making the package size extremely small with high packing density, the fingers 120 are typically made very small in size and arranged in very close proximity to each other; and therefore, it would be highly difficult to quickly and accurately check the total number of the fingers 120 through visual inspection and mental counting by the fabrication engineers. The results would therefore highly untrustworthy.

Related patents, include, for example, the U.S. Pat. No. 5,898,213 entitled "SEMICONDUCTOR PACKAGE BOND POST CONFIGURATION". This patent teaches the use of a staggered finger layout design to reduce finger pitch for compact design of the package size. However, the use of this patent would still make it highly difficult to quickly and accurately check the total number of the fingers through visual inspection and mental counting by the fabrication engineers.

SUMMARY OF THE INVENTION

It is therefore an objective of this invention to provide an integrated-circuit package with a quick-to-count finger layout design on substrate, which can help fabrication engineers to count the total number of the fingers on the substrate more quickly and accurately than the prior art.

In accordance with the foregoing and other objectives, the invention proposes an integrated-circuit package with a quick-to-count finger layout design on substrate.

Broadly recited, the integrated-circuit package with a quick-to-count finger layout design according to the invention comprises the following components: (a) a substrate; (b) a line-up finger array over the substrate, the line-up finger array including: (b1) a plurality of first-shape fingers partitioned equally in number into a plurality of subgroups, each subgroup containing a predetermined number of the first-shape fingers; and (b2) a plurality of second-shape fingers, which are substantially visually distinguishable in outer appearance from the first-shape fingers, and which are interposed between adjacent subgroups of the first-shape fingers to serve as count tokens; and (c) a semiconductor chip mounted over the substrate and wire-bonded to the first-shape fingers and second-shape fingers over the substrate.

To allow the second-shape fingers, which serve as count tokens, to be visually distinguishable from the first-shape fingers, feasible layout design schemes include the use of two different sizes, shapes, and colors respectively for the second-shape fingers and the first-shape fingers. The fabrication engineers can count the total number of the line-up array of fingers on the substrate simply by counting the total number of the second-shape fingers and then multiply the result by the total number of first-shape fingers in each subgroup plus one. Compared to the prior art, it is apparent that the invention allows the fabrication engineers to count the total number of the fingers on the substrate more easily and accurately.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention is disclosed in full details by way of two preferred embodiments in the following with reference to FIG. 2 and FIG. 3, respectively.

Figure 2:
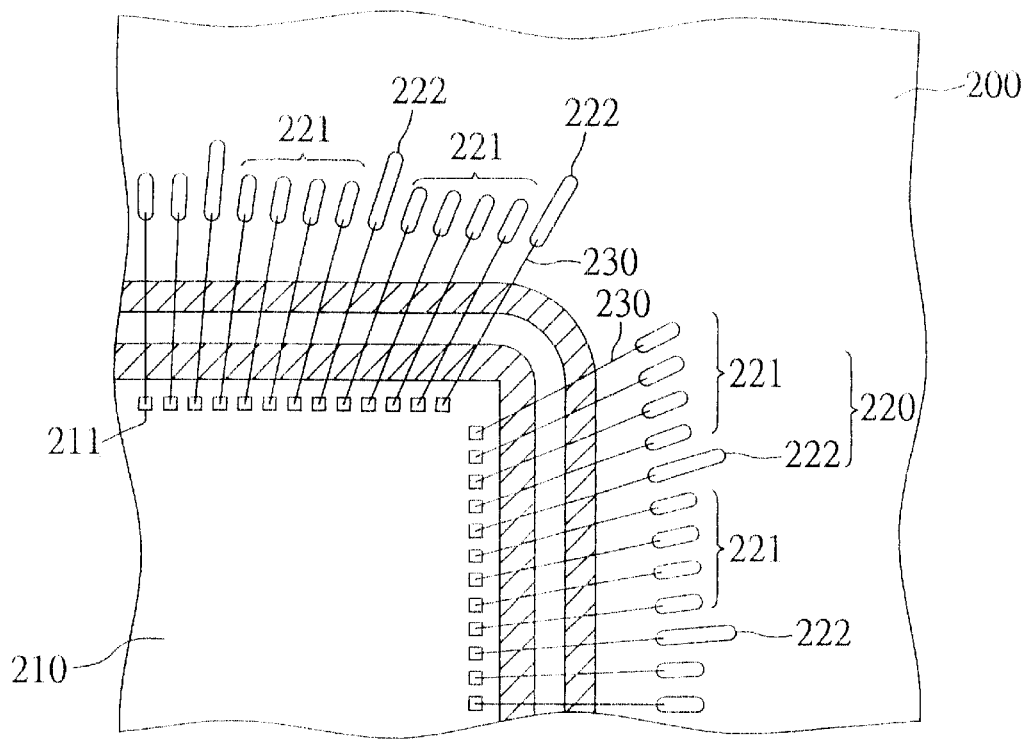
FIG. 2 shows a schematic plan view of a first preferred embodiment of an integrated-circuit package with a quick-to-count finger layout design on substrate according to the invention.

First Preferred Embodiment (FIG. 2)

FIG. 2 shows a schematic plan view of a first preferred embodiment of an integrated-circuit package with a quick-to-count finger layout design on substrate according to the invention.

As shown, the integrated-circuit package includes: (a) a substrate 200; (b) a semi-conductor chip 210 mounted over the substrate 200, and whose top surface is formed with a plurality of bond pads 211; (c) a line-up array of fingers 220 surrounding the semiconductor chip 210; and (d) a plurality of bonding wires 230 for connecting the bond pads 211 respectively to the line-up array of fingers 220 (note that FIG. 2 is a simplified schematic diagram showing only those parts that are related to the invention; the actual layout on the substrate 200 may be much more complex).

It is a characteristic feature of the invention that the line-up array of fingers 220 includes a plurality of first-shape fingers 221 and a plurality of second-shape fingers 222, wherein the second-shape fingers 222 are interposed among the first-shape fingers 221 in such a manner as to partition the first-shape fingers 221 into a plurality of subgroups, each subgroup containing an equal number of the first-shape fingers 221, for example four (4). Further, the second-shape fingers 222 are made in such a manner as to be substantially visually distinguishable in outer appearance from the first-shape fingers 221.

The foregoing finger layout design allows the second-shape fingers 222 to serve as "count tokens" each representing a subtotal of the line-up array of fingers 220. By this finger layout design, fabrication engineers can check the total number of the line-up array of fingers 220 simply by counting the total number of the second-shape fingers 222, each of which represents the total number of first-shape fingers 221 in each subgroup plus one.

In the case of FIG. 2, for example, the line-up array of fingers 220 are made in such a manner that the second-shape fingers 222 are greater in length than the first-shape fingers 221 to an extent that allows vision to easily distinguish the second-shape fingers 222 from the first-shape fingers 221. Moreover, each subgroup of the first-shape fingers 221 contains four (4) of the first-shape fingers 221; and therefore, each count of the second-shape fingers 222 represents a subtotal of five (5) fingers on the substrate 200.

Figure 1:
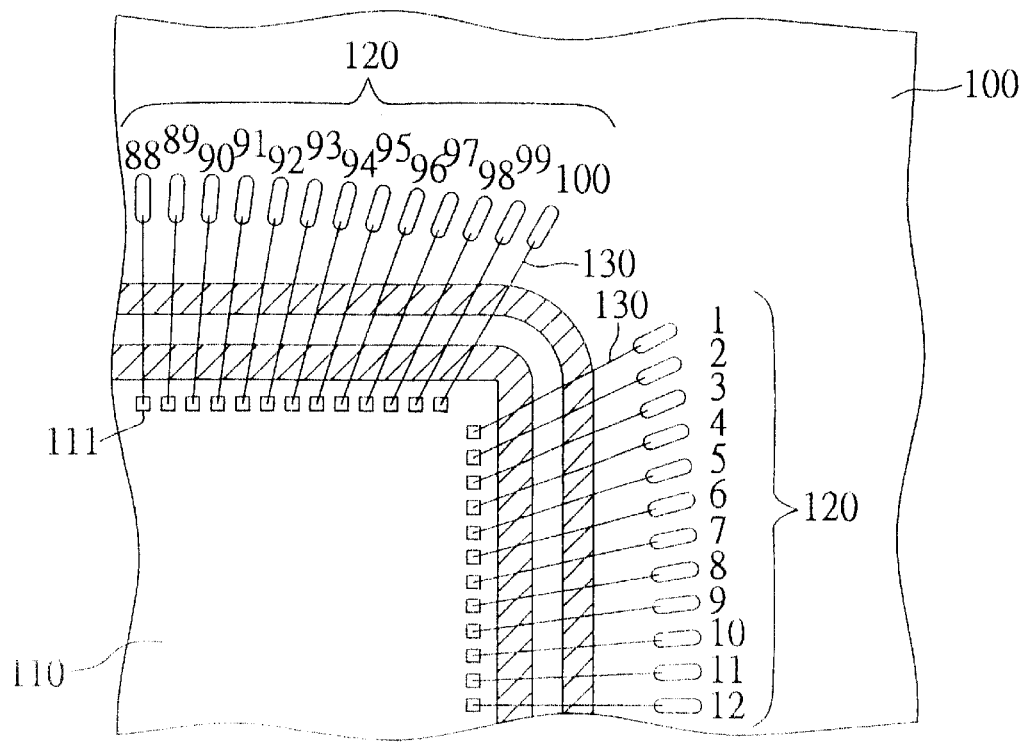
FIG. 1 (PRIOR ART) shows a schematic plan view of an integrated-circuit package with a conventional finger layout design on substrate.

Compared to the prior art of FIG. 1, it is undoubtedly that the invention allows the fabrication engineers to check the total number of the line-up array of fingers 220 on the substrate 200 more quickly and accurately through visual inspection and mental counting.

Figure 3:
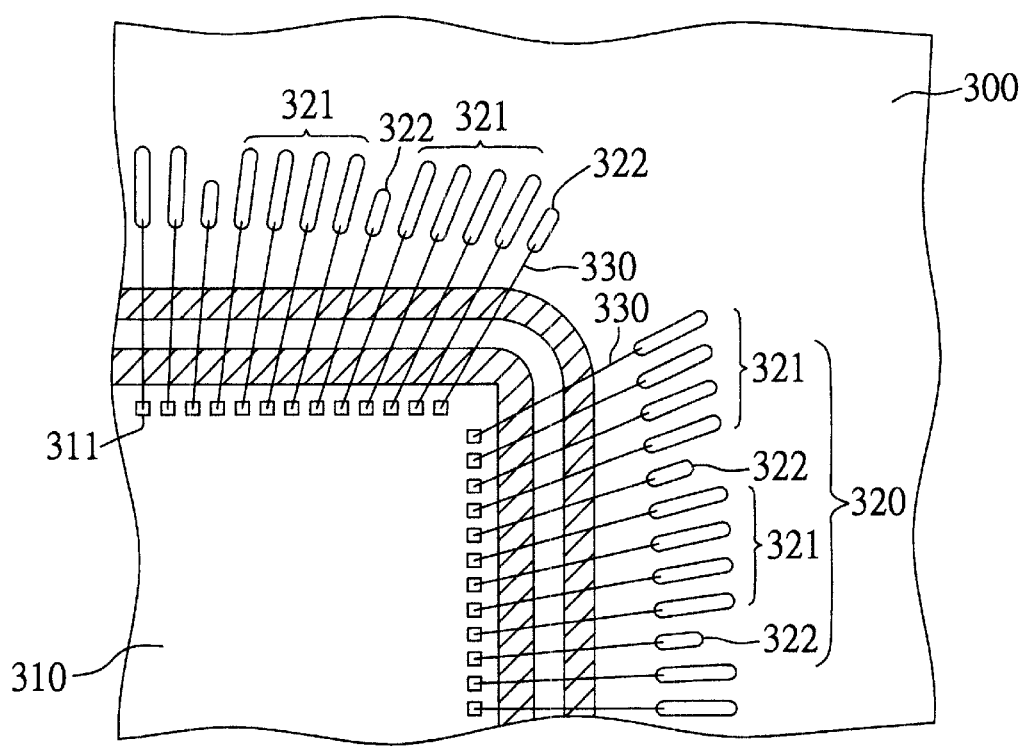
FIG. 3 shows a schematic plan view of a second preferred embodiment of an integrated-circuit package with a quick-to-count finger layout design on substrate according to the invention.

Second Preferred Embodiment (FIG. 3)

FIG. 3 shows a schematic plan view of a second preferred embodiment of an integrated-circuit package with a quick-to-cot finger layout design on substrate according to the invention.

As shown, the integrated-circuit package includes: (a) a substrate 300; b) a semi-conductor chip 310 mounted over the substrate 300, and whose top surface is formed with a plurality of bond pads 311, (c) a line-up array of fingers 320 surrounding the semiconductor chip 310; and (d) a plurality of bonding wires 330 for connecting the bond pads 311 respectively to the line-up array of fingers 320 (note that FIG. 3 is a simplified schematic diagram showing only those parts that are related to the invention; the actual layout on the substrate 300 may be much more complex).

It is a characteristic feature of the invention that the line-up array of fingers 320 includes a plurality of first-shape fingers 321 and a plurality of second-shape fingers 322, wherein the second-shape fingers 322 are interposed among the first-shape fingers 321 in such a manner as to partition the first-shape fingers 321 into a plurality of subgroups, each subgroup containing an equal number of the first-shape fingers 321, for example four (4). Further, the second-shape fingers 322 are made in such a manner as to be substantially visually distinguishable in outer appearance from the first-shape fingers 321.

In the embodiment of FIG. 3, for example, the line-up array of fingers 320 are made in such a manner that the second-shape fingers 322 are smaller (rather than greater as in the embodiment of FIG. 2) in length than the first-shape fingers 321 to an extent that allows vision to easily distinguish the second-shape fingers 322 from the first-shape fingers 321. Moreover, each subgroup of the first-shape fingers 321 contains four (4) of the first-shape fingers 321, and therefore, each count of the second-shape fingers 322 represents a subtotal of five (5) fingers on the substrate 300. This allows the fabrication engineers check the total number of the line-up array of fingers 320 simply by counting through the second-shape fingers 322 and then multiply the result by five (5).

Compared to the prior art of FIG. 1, it is undoubtedly that the invention allows the fabrication engineers to check the total number of the line-up array of fingers 320 on the substrate 300 more quickly and accurately through visual inspection and mental counting.

Conclusion

In conclusion, the invention provides an integrated-circuit package with a quick-to-count finger layout design on substrate that can help fabrication engineers to visually check the total number of fingers on the substrate more quickly and accurately than the prior art. It is to be noted that the second-shape fingers that serve as "count tokens" are not limited to the first and second embodiments disclosed above. Broadly speaking, the second-shape fingers can be any various other sizes and shapes that allow them to be visually distinguishable from the first-shape fingers.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An integrated-circuit package, which comprises:
   (a) a substrate;
   (b) a line-up finger array over the substrate, the line-up finger array including:
      (b1) a plurality of first-shape fingers partitioned equally into a plurality of subgroups, each subgroup containing a predetermined number of the first-shape fingers; and
      (b2) a plurality of second-shape fingers, which are substantially visually distinguishable in outer appearance from the first-shape fingers, and which are interposed between adjacent subgroups of the first-shape fingers to serve as count tokens, each count token representing a predetermined subtotal of the line-up array of fingers; and
   (c) a semiconductor chip mounted over the substrate and wire-bonded to the first-shape fingers and second-shape fingers over the substrate.

2. The integrated-circuit package of claim 1, wherein the second-shape fingers are greater in length than the first-shape fingers.

3. The integrated-circuit package of claim 1, wherein the second-shape fingers are smaller in length than the first-shape fingers.

4. The integrated-circuit package of claim 1, wherein the line-up finger array of the first-shape fingers and the second-shape fingers are arranged around the semiconductor chip.

5. An integrated-circuit package, which comprises:
   (a) a substrate;
   (b) a line-up finger array over the substrate, the line-up finger array including:

(b1) a plurality of first-shape fingers partitioned equally into a plurality of subgroups, each subgroup containing a predetermined number of the first-shape fingers; and (b2) a plurality of second-shape fingers, which are greater in length than the first-shape fingers, and which are interposed between adjacent subgroups of the first-shape fingers to serve as count tokens, each count token representing a predetermined subtotal of the line-up array of fingers; and (c) a semiconductor chip mounted over the substrate and wire-bonded to the first-shape fingers and second-shape fingers over the substrate.

6. The integrated-circuit package of claim 5, wherein the line-up finger array of the first-shape fingers and the second-shape fingers are arranged around the semiconductor chip.

7. An integrated-circuit package, which comprises:

(a) a substrate;

(b) a lineup finger array over the substrate, the line-up finger array including:

(b1) a plurality of first-shape fingers partitioned equally into a plurality of subgroups, each subgroup containing a predetermined number of the first-shape fingers; and (b2) a plurality of second-shape fingers, which are smaller in length than the first-shape fingers, and which are interposed between adjacent subgroups of the first-shape fingers to serve as count tokens, each count token representing a predetermined subtotal of the line-up array of fingers; and (c) a semiconductor chip mounted over the substrate and wire-bonded to the first-shape fingers and second-shape fingers over the substrate.

8. The integrated-circuit package of claim 7, wherein the line-up finger array of the first-shape fingers and the second-shape fingers are arranged around the semiconductor chip.

9. An integrated-circuit package, which comprises:

a substrate;

a semiconductor clip mounted over the substrate;

a plurality of first-shape fingers connected by bonding wires to the semiconductor chip, the first-shape fingers partitioned equally into a plurality of subgroups, each subgroup containing a predetermined number of the first-shape fingers;

a plurality of second-shape fingers connected by bonding wires to the semiconductor chip, the second-shape fingers being substantially visually distinguishable in outer appearance from the first-shape fingers and being interposed between adjacent subgroups of the first-shape fingers to serve as count tokens, each count token representing a predetermined subtotal of the line-up array of fingers; and wherein the bonding wires connecting the first-shape fingers to the semiconductor chip are approximately the same length as the bonding wires connecting the second-shape fingers to the semiconductor chip.

10. The integrated-circuit package of claim 9, wherein the second-shape fingers are greater in length than the first-shape fingers.

11. The integrated-circuit package of claim 9, wherein the second-shape fingers are smaller in length than the first-shape fingers.

12. The integrated-circuit package of claim 9, wherein the first-shape fingers and the second-shape fingers are arranged around the semiconductor chip.

* * * * *